(12) United States Patent
Stichling et al.

(10) Patent No.: US 11,016,471 B2
(45) Date of Patent: May 25, 2021

(54) COMMITMENT OF TECHNICAL DEVELOPMENT DATA

(71) Applicant: dSPACE digital signal processing and control engineering GmbH, Paderborn (DE)

(72) Inventors: Dirk Stichling, Paderborn (DE); Jobst Richert, Lippstadt (DE); Michael Beine, Altenbeken (DE); Ansgar Kuhlmann, Paderborn (DE); Thomas Misch, Paderborn (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 265 days.

(21) Appl. No.: 16/192,822

(22) Filed: Nov. 16, 2018

(65) Prior Publication Data
US 2019/0155256 A1 May 23, 2019

(30) Foreign Application Priority Data
Nov. 21, 2017 (DE) .......................... 102017127400.6

(51) Int. Cl.
*G05B 19/4155* (2006.01)
*G06F 30/00* (2020.01)
(52) U.S. Cl.
CPC ......... *G05B 19/4155* (2013.01); *G06F 30/00* (2020.01); *G05B 2219/31106* (2013.01)

(58) Field of Classification Search
CPC .................. G05B 19/4155; G05B 2219/31106
See application file for complete search history.

(56) References Cited

U.S. PATENT DOCUMENTS

| 6,182,245 | B1* | 1/2001 | Akin | G06F 11/3672 |
| | | | | 711/100 |
| 7,506,307 | B2* | 3/2009 | McCollum | G06F 11/0709 |
| | | | | 717/117 |
| 2003/0126586 | A1* | 7/2003 | Sluiman | G06F 11/3684 |
| | | | | 717/124 |
| 2013/0085979 | A1* | 4/2013 | Grechanik | G06N 5/025 |
| | | | | 706/48 |

(Continued)

FOREIGN PATENT DOCUMENTS

WO        WO 0067156 A2    11/2000

*Primary Examiner* — Wei Y Zhen
*Assistant Examiner* — Binh Luu
(74) *Attorney, Agent, or Firm* — Leydig, Voit & Mayer, Ltd.

(57) ABSTRACT

A method for semi-automated development data management for control devices includes saving a development data model in a central data store comprising a plurality of mutually related configuration data units, wherein the configuration data units each store control commands and/or configuration parameters. The method further includes providing a ruleset and identifying an initial configuration data unit, wherein it is possible, using the ruleset, to identify further configuration data units automatically on a basis of a relationship thereof with the initial configuration data unit. In addition, the method includes applying the provided ruleset to the development data model in order to identify a subset of configuration data units within the development data model and saving the identified subset.

18 Claims, 4 Drawing Sheets

(56) References Cited

U.S. PATENT DOCUMENTS

| | | | |
|---|---|---|---|
| 2015/0235154 A1* | 8/2015 | Utschig | G06Q 10/0637 |
| | | | 705/7.36 |
| 2016/0188433 A1* | 6/2016 | Kube | G06F 11/27 |
| | | | 714/26 |
| 2018/0088753 A1* | 3/2018 | Viegas | G06F 40/216 |
| 2018/0285685 A1* | 10/2018 | Singh | G06F 16/9024 |

* cited by examiner

COMMITMENT OF TECHNICAL DEVELOPMENT DATA

CROSS REFERENCE TO RELATED APPLICATIONS

This application claims benefit to German Patent Application No. DE 10 2017 127 400.6, filed Nov. 21, 2017, which is hereby incorporated by reference herein.

FIELD

The present invention is directed to a method for semi-automated management of technical development data that relate for example to a test configuration of a control device or a terminal. The present invention in particular provides a method for committing data objects that model technical development data, and in particular a new way of addressing technical databases. The present invention is furthermore directed to a computer system for development data management and to a computer program product comprising control commands that implement the proposed method and/or operate the proposed computer system.

BACKGROUND

WO 00/67156 A1 discloses semantic modeling of data units, without detailing technical specifications. In general, this document discloses managing data objects, including specifiable relations.

In the case of control devices, it is known to create test scenarios which are for example modeled such that environment parameters are not actually present in the real world, but instead said parameters are specified on the basis of models and are then read in during a test of a control device. In this case, physical forces therefore do not have to actually act on a test assembly, but instead such forces can be modeled as electronic control signals and fed into a test model. This therefore makes it possible to merely simulate a test and not execute it in the real world. This not only saves on costs, but can also be carried out as often as desired, empirical data being collected. In this use scenario, it is necessary to model environment parameters and to simultaneously also model a requirement profile. Control devices typically execute complex processes, and a plurality of configuration parameters is required in order to adequately test a control device before it is used in the field.

Such modeling of test data is labor-intensive, since corresponding models may be very comprehensive, and in addition a model of this kind is susceptible to errors if human inputs are to be taken into account. Since a technical requirement of a method of this kind is that it should be repeated as often as desired, and in addition underlying data should be comprehensive, a new manner of development data management is required which in particular takes account of development data of control devices. In this case it is necessary, inter alia, to create different versions of test configurations and to provide said versions separately from generic data that are developed further. Conventional semantic networks are thus not suitable per se for supporting corresponding development data management, but instead additional operations are required which take account of the technical field of use.

Data management systems are designed to manage a large amount of different data, and in particular to create relationships among said data. During the management, the "version control" or "configuration management" aspect plays a significant role. That is to say that systems of this kind not only manage the current version of the data, but must instead be able to commit a specific amount of data, such that said data can later be reproduced again exactly.

In the case of file-based systems, mechanisms such as "baselining" or "checkpoints" are used in order to commit a version for a defined amount of files. It is generally the case that the user himself specifies the files that are to be included in the baseline/checkpoint. This is typically carried out by structuring the files in folders and then carrying out the commitment using the folders.

In contrast to file-based systems, data management systems know the mutual relationships among the data because the user has previously created relationships among the data. It is thus not a loose collection of objects. These relationships mean that there may be very long dependency chains between data items.

If the user now wishes to commit the data stock of an object, including the dependent objects, in a data management system, he has to somehow determine which objects he considers to be "dependent". This decision generally cannot be made in a blanket manner, but instead depends on the user's specific case of use. In one situation, said user may wish to commit just a few dependent objects, but perhaps significantly more in another case.

The problem is therefore that a user wishes to control, for different cases of use, which dependent objects should be committed and which should not.

Since the underlying data or objects to be modeled are comprehensive, a further problem is that a human user must manage all datasets or objects in order to specify cases of use, which ceases to be possible above a particular amount. This furthermore means that the likelihood of incorrect modeling is very high and distorted test results of a terminal or of a control device may arise. There is therefore generally a need for a new method that can be automated at least in part, such that corresponding development data do not need to be managed individually, but instead specific units can be formed that can easily be managed as a whole. In particular, a new data structure is to be created for this purpose.

SUMMARY

In an embodiment, the present invention provides a method for semi-automated development data management for control devices. The method includes saving a development data model in a central data store comprising a plurality of mutually related configuration data units, wherein the configuration data units each store control commands and/or configuration parameters. The method further includes providing a ruleset and identifying an initial configuration data unit, wherein the ruleset is useable to identify further configuration data units automatically on a basis of a relationship thereof with the initial configuration data unit. In addition, the method includes applying the provided ruleset to the development data model in order to identify a subset of configuration data units within the development data model and saving the identified subset.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
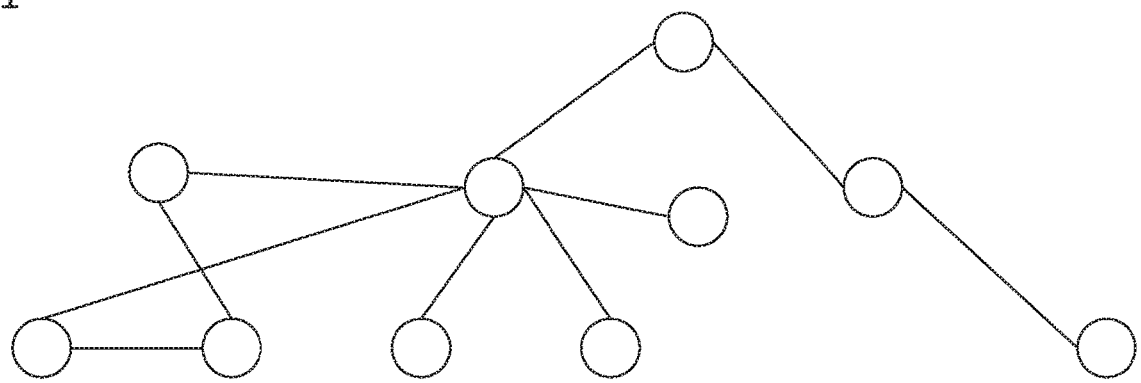
FIG. 1 shows a schematic layer structure that connects the control device to the development data model, and the ruleset based thereon, according to an embodiment of the present invention.
Figure 1:
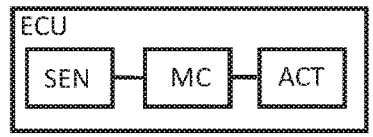

Embodiments of the present invention provide improved methods for semi-automated development data management that make it possible to reliably manage comprehensive datasets in a manner requiring little technical outlay. Embodiments of the present invention further provide correspondingly configured computer systems and computer program products comprising control commands that implement the method and/or operate the computer system.

According to an embodiment of the invention, a method for semi-automated development data management for control devices is provided, comprising saving a development data model in a central data store comprising a plurality of mutually related configuration data units, the configuration data units in each case saving control commands and/or configuration parameters, providing a ruleset and identifying at least one initial configuration data unit, it being possible, using the ruleset, to identify further configuration data units automatically on the basis of the relationship thereof with the initial configuration data unit, applying the provided ruleset to the development data model in order to identify a subset of configuration data units within the development data model, and saving the identified subset.

In this case, a person skilled in the art will recognize that the method steps mentioned may comprise further substeps and may be executed iteratively and/or in a different sequence. For example, it is possible to perform the steps of saving the development data model and providing a ruleset in parallel or in the reverse sequence. Furthermore, the development data model can be composed in an iterative manner, from partial models.

The proposed method is a semi-automated method, since the proposed method at least has to be initiated by a human user. Said user must select at least one initial object or a configuration data unit in accordance with one aspect, and must, if necessary, participate in the creation of a ruleset. As soon as this has taken place, it is possible, using the proposed method, to identify further objects or configuration data units on the basis of the relationship thereof or further criteria, which objects or units can then be saved as a separate version.

Development data can be any datasets that are used when developing control devices, in particular in a test of control devices. Said data may thus be parameters of configuration files for control devices for example. It is furthermore possible for the development data to be in the form of test data for the control device. Test data of this kind are related to an environment model that models physical conditions and may be used in a test of a control device. The proposed data model or the development data therefore does/do not have a general semantic base such that any data model can be used, but instead is/are based on technical data that relate to a control device. It is necessary precisely in this use scenario to model a plurality of dependent objects and to select said objects such that a subset or a version or even a release results. An aspect of the present invention is therefore that of being based in particular on a test specification which makes it possible to test a control device with respect to the functionality thereof.

For example, the development data are provided as a test specification which, in the present example, tests a power window. In this case, a requirement may be specified by means of the configuration data units provided, and it is furthermore possible to specify actual environment parameters, for example within the context of a test environment. A configuration data element or a configuration data unit is therefore a collective term that includes control commands and configuration parameters. In the present example, it is thus possible for the power window to be modeled such that it has to implement a function "raise". There are in addition further functions such as "stop" or "lower". A configuration data element or a configuration data unit is thus provided that models corresponding control commands.

Furthermore, requirements can be modeled using control commands. For example, a control command may trigger a check as to whether the power window performs the "stop" function in the case of resistance. This takes account of the use scenario which anticipates, for example, a child extending an arm out of the vehicle and the power window in this case moving the window pane towards the child's arm. This example demonstrates that environment models should be used, since a test scenario of this kind should not be run in a real-world situation.

In order to overcome this problem, a configuration data unit therefore models a test requirement, specifically that the control device, in the present example the power window, should perform a particular functionality at a particular resistance. This requires not only control commands, but instead also configuration parameters which specify, for example, the magnitude of the resistance that should cause the power window to stop. This thus makes it possible to specify, in the configuration data units, functions and parameters, including the values thereof, that describe a test case. A corresponding control command can then check whether the control device provides the desired functionality and can code, for example by means of a binary parameter, whether or not the control device has passed the test case. Since the different configuration data units are in a relationship, they form, as a whole, the development data model.

The development data model is preferably saved centrally, i.e. a server should preferably be provided which a plurality of users can access. The configuration data units are mutually related such that further configuration data units can be identified on the basis of an initial configuration data element or an initial configuration data unit. A ruleset is provided for this purpose, which describes which configuration data units, referred to in the following as objects, are selected. These are not generic objects, but instead objects that encapsulate control commands or parameters. These control commands or parameters are technical data within the meaning of the development data as they have already been described. It has been found, according to embodiments of the invention, that it is possible, on the basis of the objects themselves and on the basis of the relationships, to generate different views and/or versions from one development data model. Relationships, for example an inheritance or further user-specified relationships, can be used for this purpose. In this case, a user must specify, for example by means of the ruleset, that objects having specific properties are to be selected. A property of this kind may exist directly with respect to an object, or may also exist in the relationship with an object.

In order to illustrate this, another example is provided in which a first configuration data unit is provided together with further configuration data units, in a chained list. A relationship can thus express an adjacency and exists in pairs between two configuration data units. The relevant relationships thus create a chain by means of connecting the configuration data units in series. If a user now wishes to select a subset from the development data model, i.e. the chain of data units, in the simplest case he can thus simply select and configure a configuration data element or a data unit such that the remainder of the chained list in one direction is also to be selected. As a result, the user thus specifies just one single configuration data element or one data unit, and further configuration data units are added to this selection automatically. It should be noted, in this case, that this is a simple case of use that is simple to understand owing to the lack of complexity thereof.

According to embodiments of the present invention, it is furthermore possible for subsets to be formed on the basis of further relationships and properties of the configuration data units. As a result, the user thus merely has to create or select a set of rules and typically select an initial configuration data element. A subset can thus be generated from the development data model in a fully automated manner on the basis of this initial input.

As a result, test specifications can thus be generated without it being necessary for a user to specify all the requirements for the control device, but instead it is merely necessary to provide a set of rules relating to the development data model and to select an initial configuration data element. In the context of the present invention, a data unit can be used in a manner analogous to a data element or an object. Overall, a technical data structure is created that makes it possible to mutually correlate control commands within the context of configuration data units and in the process to create relationships with respect to a test specification for example.

In a subsequent method step, the provided ruleset is applied to the development data model such that individual configuration data units are picked out and a subset is thus created from the development data model. In this case, the subset comprises configuration data units and optionally relationships with respect thereto. As a result, a check is thus made as to whether the individual configuration data units comply with the ruleset, and thus all the configuration data units that are associated within the meaning of said ruleset are identified. The set of rules may provide for only specific relationships among the configuration data units to be evaluated and for those configuration data units that comply with the specified relationships to be selected. In this case, according to embodiments of the invention, different types of relationships may exist, and moreover the relationships need not be present only in pairs, as is the case within the context of graph theory, but instead relationships may connect any desired number of configuration data units. In this case, it is also not essential for one relationship to exist or to not exist between two configuration data units, but instead a plurality of relationships may also exist between two configuration data units. This results in extensive modeling of the development data model, and it is possible to cover all technical conditions.

The identified subset may for example correspond to a test specification, which is not to be understood as restrictive. In this case, all the associated development data are combined within a partial model and saved separately. In this case, "separately" refers to the fact that it is advantageous to manage the development data model away from the subset. It is thus possible for developers to further refine and extend the development data model and to commit the identified subset or to merely permit read options therefor. A separate version or configuration is thus created by means of the identified subset, which version or configuration can also be referred to as a release. Since a release of this kind is used with regard to the control device on which it is based, no further amendments should be made thereto. Within the context of the further development, it should only be possible to continue the development data model but without modifying the existing release.

In this case, it is also possible for a plurality of versions of the release to be created, such that the method steps are performed iteratively and the identified subset is saved repeatedly. A development data model can thus be used in a first state and can provide a first identified subset, and a second, developed development data model can then establish a second subset at a later time.

It is thus possible to create product specifications or test specifications that are to be managed mutually independently. In this case, different development data models, or one single development data model, is/are used. It is also particularly advantageous to use a generic development data model for a plurality of control device types and to identify a subset therefrom for a specific control device or a specific control device type, using the ruleset. As a result, a manufacturer of a plurality of control device types need only maintain one development data model, and in this case can generate a subset from the generic development data model depending on the desired control device type.

The problem of different objects or development data models needing to be managed manually according to the prior art, which is time-consuming and prone to errors, is thus overcome according to embodiments of the invention. According to conventional semantic graphs, there is a problem that, in the event of commitment, i.e. in the event of a release of an object, all dependent objects, and in turn the dependent objects thereof, are also committed in a blanket manner. In general, the user cannot decide in a manner specific to the case of use, which objects are to be included in a release.

The problem is solved by the user being able to specify what are referred to as "release configurations". A release configuration specifies which object relationships are to be taken into account when committing objects, and which are not. That is to say the user can specify a release configuration for each of his cases of use. If he then wishes to specifically commit one or more objects, he then selects one of the previously defined release configurations. The dependent objects are then also committed, according to said configuration.

In order that each user does not have to do this individually, the release configurations can be saved centrally in the data management system. In particular, a release configuration may also be configured as a configuration data unit of the development data model.

Launching release configurations allows the user to provide the commitment process with different semantic models, i.e. in one case just one single object may be committed, whereas a long chain of dependent objects may be committed in another case. It is therefore important for a user to be able to later identify, for a committed object, "how" said object was committed. There are various possible solutions for this:

The release configuration by means of which the object was committed is annotated for each committed object. There may in principle be a plurality of release configurations, since an object is for example committed initially using a "weak" release configuration and later using a "stronger" release configuration.

When defining the release configurations, the user can define hierarchies, i.e. a type of "inheritance" of release configurations. Said user could, for example, define a release configuration as "Project Release", for which he specifies the relevant relationship types. Said user then creates a derivation of "Project Release", denoted "Workplace Release". Said release automatically inherits the relevant relationship types from "Project Release". The user can then additionally specify further relationship types that are also relevant. This inheritance formally specifies which release configurations are stronger and which are weaker. The advantage thereof is that only the strongest release configuration has to be saved on an object. The users should at least ideally always work in this manner. If release configurations do not originate from an inheritance line, then a plurality of release configurations must in addition be saved in this solution too.

The test manager works in a workspace. The workspace in each case contains a test management project comprising test specifications, and a requirements project comprising requirements. The task of the test manager is to manage and further develop the test specifications. The individual test specifications are correlated to corresponding requirements.

Different cases of use exist in which the test manager wishes to commit his test specifications:

When developing a test specification, the test manager wishes to retain the version of this specification, in order, for example, to be able to use said version later for the purpose of a comparison. However, he does not wish to commit other objects, such as the linked requirements. He therefore creates a release configuration named "Archive Test Specification". He specifies here that only the test specifications themselves, but no dependent objects, are committed. He can now "archive" his test specifications using these release configurations.

At specific milestones, the entirety of the test specifications for a development project should be committed. In this example, these are precisely the test specifications that are contained in a test management project. The test manager therefore creates a "Test Milestone" release configuration. He specifies, for this release configuration, that all the test specifications, including the parameters thereof, that are contained in a project should be committed. At the time of the milestone, he then commits the entire contents of the test management project, using the release configuration.

At the end of the development project, the entirety of the test specifications and the requirements should be committed as a unit. A release configuration named "Workspace Release" is created for this purpose. This specifies that all the projects of a workspace, including all the objects contained, should be committed. Applying this release configuration to the workspace commits both the test management project and the requirement project, including the relationships between the projects.

The release configuration mentioned here can also be included in the above-mentioned hierarchy: Archive Test Specification–>Test Milestone–>Workspace Release.

In contrast to file-based systems, the difference here is that no modeled dependencies exist among the files in file-based systems. A user therefore has to always manually select the files or folders that he wishes to commit as a unit (baseline, checkpoint, etc.).

According to one aspect of the present invention, the step of saving the identified subset is carried out separately, such that the development data model is not overwritten. The advantage of this is that developers can continue to work on the development data model, i.e. can refine, extend or even delete parts, without a version or a subset being affected in the process. Vice versa, it is possible for a subset to be backed up by means of a separate step of saving, and not overwrite the development data model. It is thus possible to continue to work on the development data model, which integrates the identified subset into a control device and/or can be implemented.

According to a further aspect of the present invention, the entire saved development data model is subject to a different assignment of permissions than the saved identified subset. The advantage of this is that the development data model can be managed in a fine-grained manner, but can also be managed such that the entirety thereof is editable. Irrespective thereof, the identified subset can be backed up, and different read and write permissions can be granted from those in the case of the development data model. This in turn takes account of the fact that the development data model is intended to be developed by a plurality of developers, and the identified subset is intended to be delivered to a client or even integrated into a control device unmodified.

According to a further aspect of the present invention, write access to the saved identified subset is prohibited. The advantage of this is that rights management can be provided, which protects the identified subset from being accessed, and only read access is permitted. The identified subset is therefore an end product that is used and therefore should not be modified. This therefore ensures that the subset is provided as a static dataset that should not be modified. If, however, a new version is to be created, it is thus possible to again identify and save a separate subset. Different versions are thus created that are each conclusively defined.

According to a further aspect of the present invention, an additional configuration data unit is saved to the identified subset, the additional configuration data unit comprising information regarding the initial configuration data units, the provided ruleset, the configuration data units of the identified subset, and/or further information regarding the framework conditions of the method. In the case of a central data store that is configured as a database, the additional configuration data units may be independent database objects. In this case, said data units generally comprise information from which the initial configuration data units, the provided ruleset, and the configuration data units of the identified subset can be derived. Further information regarding the framework conditions of the method may also be derivable or directly contained. In this case, typical items of information are the user who has triggered the release or the versioning by means of the method, and the time of the release, the location and/or the technical infrastructure used, or a commentary written by the user as a description. Additional configuration data units of this kind may also be referred to as "checkpoints" or "baselines". Corresponding "checkpoints" thus provide a simple starting point for being able to display and, if required, reconstruct all the information saved by means of the method, and in particular the provided ruleset and the identified subset. Since corresponding "checkpoints" are created for each release, it is also possible to easily locate all the "checkpoints" associated with a configuration data unit, since said checkpoints are all related to the corresponding configuration data unit. It is thus possible to very easily obtain an overview of all the saved states of the configuration data unit.

According to a further aspect of the present invention, the initial configuration data units saved as part of the identified subset comprise a reference to the provided ruleset. This reference makes it possible to also retrospectively determine the identified subset.

According to a further aspect of the present invention, the provided ruleset is part of a hierarchically structured body of rulesets. The hierarchically structured body of rulesets makes it possible to classify the "strength" of one ruleset compared with other rulesets. In this case, "strength" refers to the size of the subset of the development data model that is to be identified using the ruleset. When applied to the same initial configuration data unit, a "stronger" ruleset identifies a subset comprising more configuration data units of the development model that were saved in the previous method step.

According to a further aspect of the present invention, the step of saving the identified subset is carried out iteratively. The advantage of this is that a plurality of versions of the subset can be created without it being necessary to modify previously identified subsets in the process. A plurality of subsets is thus generated from the development data model, for example in a temporally offset manner, and different versions result. It is thus possible to save a first subset as a release version 1, and to save a second subset as a release version 2.

According to a further aspect of the present invention, the development data model models a test specification of the control device. The advantage of this is that the development data model describes control commands and parameters that are used to check the control device such that it is possible to ascertain whether the control device complies with a particular specification. For example, a test may be specified in the development data model, and values for such a test can be provided on the basis of the configuration parameters. Using the example of the power window, it is possible to demonstrate that a control command may be provided which checks whether the functionality of stopping the movement of the window pane is correctly implemented. In this case, the configuration parameters may specify a first or a second resistance. If a subset is generated herefrom, it is possible to specify, by means of the ruleset, that strict requirements are to be made of the test. For example, in the development data model, a first configuration parameter describes that, at a specific resistance, the window pane must stop within 10 milliseconds, and a second configuration parameter describes that the window pane must stop within 20 milliseconds. The ruleset is then applied and it is possible to determine, by means of the relationships, which objects are associated with a strict test. As a result, a further object, specifically a configuration data unit, is thus selected for the control command "check", which object specifies that the window pane must stop within 10 milliseconds. The development data model thus comprises one or more test specifications, the subset selecting the relevant control commands or configurations herefrom.

According to a further aspect of the present invention, at least one control command describes a condition for a functionality of the control device. The advantage of this is that individual test cases can be specified, and corresponding conditions can be checked, depending on which objects are contained in the subset. As a result, it may thus be possible for a superordinate condition "security function present" to be specified by means of one control command, and for dependent objects to specify further control commands such as "power window operating correctly". The functionality of the control device can thus be checked on the basis of the control commands, and the test specification and/or identified subset can be applied.

According to a further aspect of the present invention, at least one configuration parameter describes a requirement parameter for the control device. The advantage of this is that a target configuration can be described, and it is possible to check, on the basis of the control commands, whether or not the specific requirement parameter is complied with. In the present example, the requirement parameter may specify that, at a specific resistance, the window pane must stop within 10 milliseconds.

According to a further aspect of the present invention, a relationship exists indirectly between at least two configuration data units. The advantage of this is that relationships do not always have to be defined in pairs, but instead a relationship may also exist among a plurality of objects or configuration data units. Said relationship also does not have to be indirect, but it is instead possible, figuratively speaking, to form partial graphs. In the case of a chained list, there is therefore also a relationship between the first element of the list and the last element of the list, even if further elements are arranged therebetween. When identifying partial graphs it is thus also possible, figuratively speaking, to jump over objects and for a specifiable relationship to still exist.

According to a further aspect of the present invention, a relationship comprises a hierarchy, an inheritance, an association and/or a user-defined semantic model. The advantage of this is that different relationships can be evaluated by the ruleset, and it is thus possible to identify different configuration data units proceeding from different aspects. Different use scenarios can thus be modeled.

According to a further aspect of the present invention, the step of saving the development data model to a server and/or the step of applying the provided ruleset is initiated by means of a client. The advantage of this is that the development data model is accessible to different developers, since said developers do not manage or access the development data model locally, but instead said model is called up from a server. Only the application of the provided ruleset is not carried out until a client or a user has triggered this.

According to a further aspect of the present invention, the method steps are performed by distributed network components. The advantage of this is that the data can be stored externally, and therefore identified subsets can be saved at different network nodes. Furthermore, different users are able to individually specify the ruleset and then call up corresponding development data from the server. The identified subset can then be saved locally, or on the server.

According to a further aspect of the present invention, the development data model describes generic data for a plurality of control device types and the identified subset is limited to one control device type. The advantage of this is that the development data model can generically describe different control device types, and in this case functionalities that are supported by all control device types do not need to be modeled multiple times. A manufacturer can automatically identify a subset for an individual control device type and a development data model can thus be maintained centrally, while different views can be generated depending on a control device type. This ensures storage efficiency and in addition reduces the amount of work required. This results in the advantage that it is not necessary to generate a separate development data model for each control device type, but instead different control device types can be modeled in a single generic development data model which in addition comprises specifics of the individual control device types.

In an embodiment, the present invention provides a computer system for semi-automated development data management for control devices, comprising a first central data store that is configured for storing a development data model, comprising a plurality of mutually related configuration data units, the configuration data units in each case saving control commands and/or configuration parameters, a logic unit that is configured for providing a ruleset and identifying at least one initial configuration data unit, it being possible, using the ruleset, to identify further configuration data units automatically on the basis of the relationship thereof with the initial configuration data unit, an execution unit that is configured for applying the provided ruleset to the development data model in order to identify a subset of configuration data units within the development data model, and a data store that is configured for saving the identified subset.

The first central data store and the data store for saving the identified subset may be the same data store or separate data stores. The above-mentioned components can be interconnected by means of a network and can thus be operated in a computer network.

In an embodiment, the present invention also provides a computer program product comprising control commands that implement the proposed method and/or operate the proposed computer system.

It is particularly advantageous, according to embodiments the invention, for the method to teach method steps that can be reproduced structurally by the computer system. Structural features of the computer system thus provide a functionality that corresponds to the functionality of the method steps. The computer system is thus configured to execute the proposed method, and the proposed method is configured to operate the computer system.

Further advantageous embodiments are explained in greater detail with reference to the accompanying drawings. In the drawings:

FIG. 1 shows a multi-layer model, a control device which, in the present case, is described by means of a development data model, being shown in the lowest layer 0. The control device (electronic control unit, ECU) comprises a microcontroller MC, a sensor interface SEN and an actuator interface ACT. It is further possible to describe a test case of the control device by means of the development data model. In this case, an ECU comprising a sensor and actuator interface was selected as the control device, the proposed method being suitable for performing development data management for any type of control device or ECU. The example shown is therefore merely a non-limiting example. Further examples of control devices are ECUs comprising just one of the interfaces (for a sensor or actuator) or virtual ECUs (referred to as V-ECUs) which are software reproductions of real ECUs, comprising the algorithm of the control device in the form of an application layer, and sometimes further software layers such as operating system/OS or hardware and software abstraction layers.

The development data model is depicted on the next-highest level 1. In the present case, the development data model is shown pictorially as a graph consisting of nodes and edges. In this case, the nodes each describe a configuration data element or a configuration data unit, and the edges describe relationships. For reasons of simplicity, all the nodes and edges are depicted identically, embodiments of the present invention also taking account of different node properties and different relationships. Furthermore, the fact that objects are always connected in pairs is intended to be understood as being merely by way of example. Instead, it is also possible for various relationships to exist between two objects or nodes, or for various objects to exist.

A ruleset is shown on the next-highest level 2 which comprises individual rules that access the development data model of level 1.

The development data model of level 1 is saved and the ruleset according to level 2 is then provided. In this case, the ruleset describes the individual configuration data units, in the present case nodes, including relationships, such that it is possible to select further configuration data units proceeding from an initial configuration data unit. In the present case, the control commands and configuration parameters that the configuration data units comprise are not shown. Requirements placed on the control device according to level 0 can in turn be specified as control commands. Control commands may for example be commands for actuating a computer system, in particular a computer system for text execution. Furthermore, control commands can also be checks of conditions, as are often checked when executing automated tests.

Figure 2:
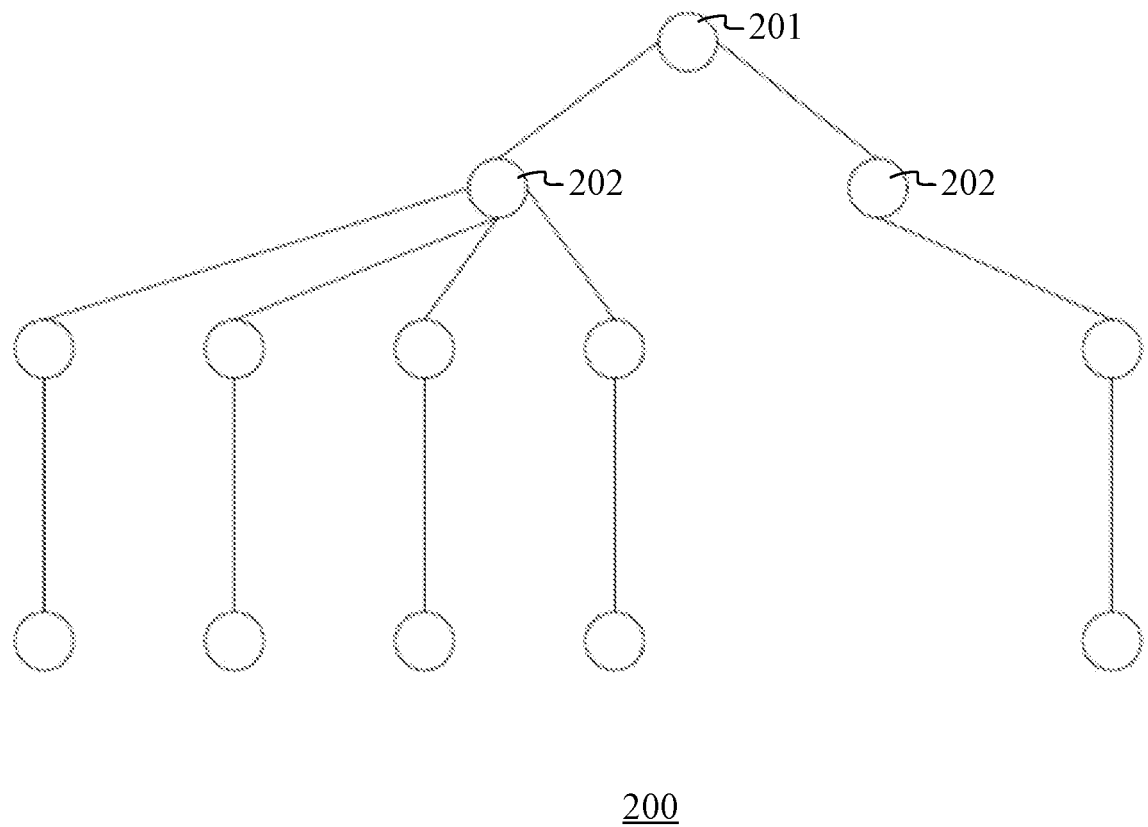
FIG. 2 schematically shows an identified subset of the development data model according to an embodiment of the present invention.

The way in which the semi-automated development data management is then performed is also explained, by way of example, with reference to FIG. 2. In this case, this is an identified subset which is thus taken from level 1 of FIG. 1.

FIG. 2 shows an identified subset, the ruleset being applied to level 1 of FIG. 1, and an initial node thus being selected. In this case, level 1 according to FIG. 1 is to be understood merely schematically and comprises a plurality of configuration data units, i.e. nodes, only a few being shown in the present case. The development data model typically comprises several thousand or tens of thousands of objects, which is impractical to depict in the schematic description of the drawings.

In the present case, therefore, a partial graph 200 is extracted from the development data model and saved as the identified subset. FIG. 2 shows the result thereof, an initial node 201 being selected from level 1 according to FIG. 1. Said initial node 201 is managed within the identified subset and shown at the top in FIG. 2. In this case, it is specified that all the configuration data units that have a specific relationship with said initial configuration data element should be included in the subset. This is to be performed iteratively, such that all the configuration data units having this relationship are extracted. The result is, therefore, by way of example, that two configuration data units 202 comply with this requirement, which units are then arranged below the initial configuration data element in the present FIG. 2. Since said rule is applied iteratively, and indirect relationships are also possible, a partial graph results that, merely by way of example, generates a hierarchic structure.

In highly simplified terms, the present example assumes that all the relationships form an inheritance structure. In this case, an inheritance relates to the attributes of a node that are passed on to the subnodes. It is thus possible to specify in the initial configuration data unit that a strict test should be generated. Said "strict test" attribute is inherited by the further nodes and further configuration parameters are selected that describe a strict test of this kind.

The nodes that are arranged lower down in FIG. 2 may therefore be configuration parameters that specify, for example, that a maximum stopping time is 10 milliseconds. The nodes thereabove may specify that a check of a power window is to be performed. Parallel nodes on the same level may specify that a braking system is to be tested. An associated, i.e. related, bottom node may therefore also specify how long a reaction time of a braking system may be in a strict test. The identified subset according to FIG. 2 therefore describes, in the present case as a graph, a complex test case that relates to the control device. This is described using the example of an automobile, it being explicitly emphasized that the control device may be any control device that is installed in a mobile terminal, an automobile or another device. Therefore neither the example of the automobile nor of the mobile telephone are limiting.

According to embodiments of the invention, it is particularly advantageous that the individual objects, which can also be referred to as nodes or configuration data units, can be selected automatically, and it is not necessary to generate each product description or each test case individually. The proposed data structure thus allows for automated development data management which merely has to be initiated by a user and can therefore be considered to be at least semi-automated.

Figure 3:
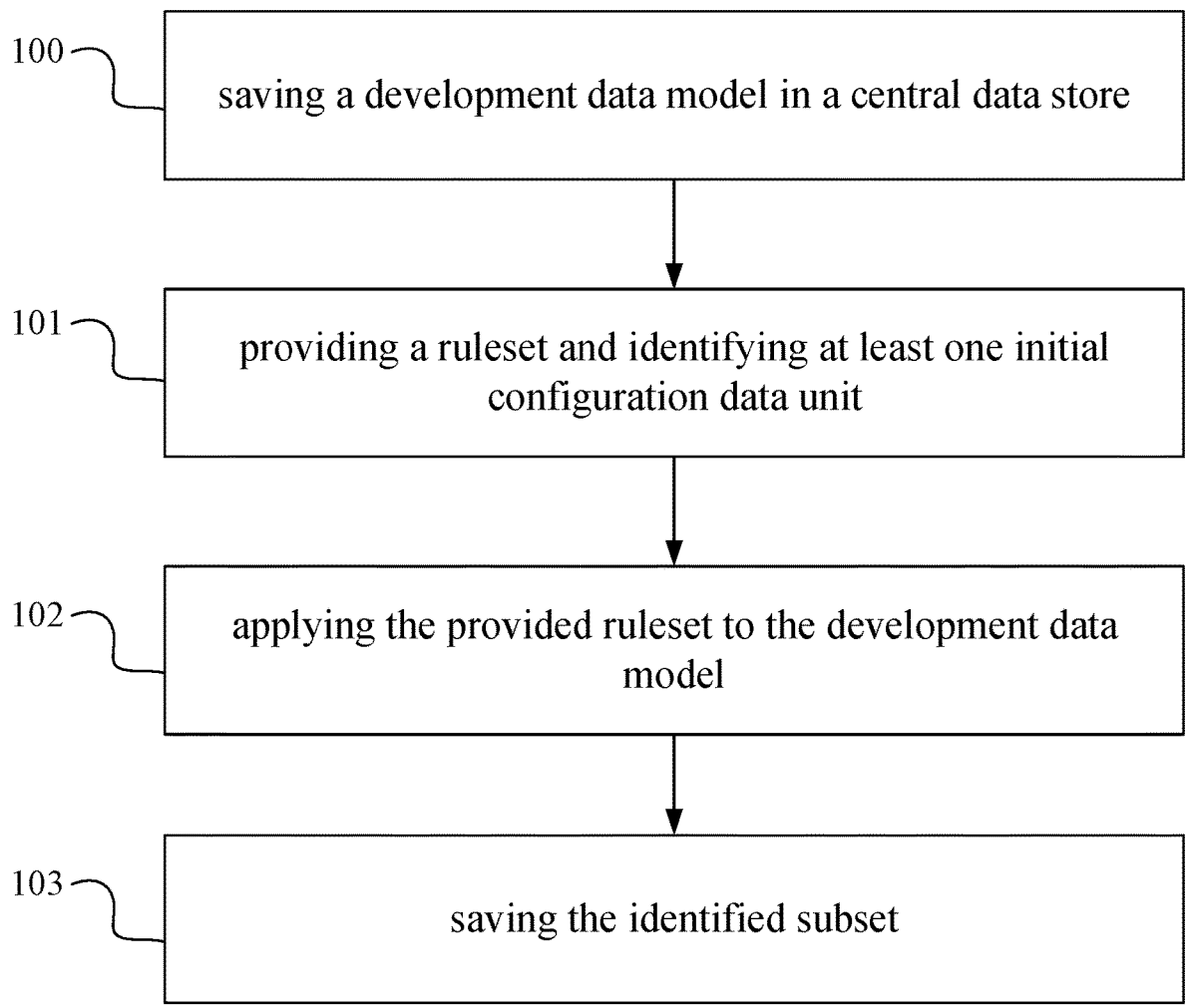
FIG. 3 is a schematic flowchart of a method for semi-automated development data management according to a further embodiment of the present invention.

FIG. 3 is a schematic flowchart of a method for semi-automated development data management for control devices, comprising saving 100 a development data model in a central data store comprising a plurality of mutually related configuration data units, the configuration data units in each case saving control commands and/or configuration parameters, providing 101 a ruleset and identifying at least one initial configuration data unit, it being possible, using the ruleset, to identify further configuration data units automatically on the basis of the relationship thereof with the initial configuration data unit, applying 102 the provided 101 ruleset to the development data model in order to identify a subset of configuration data units within the development data model, and saving 103 the identified subset.

Figure 4:
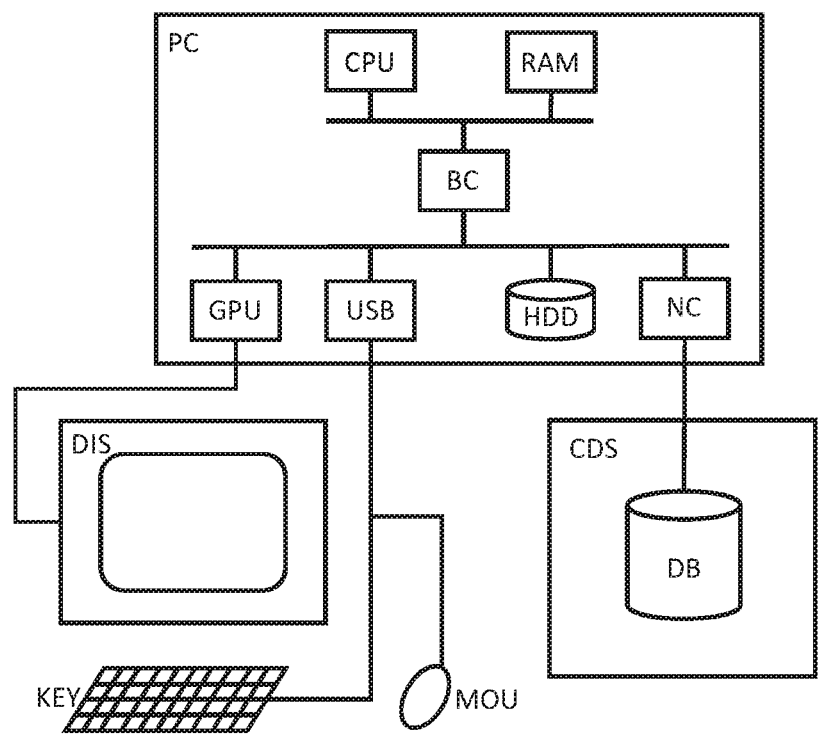
FIG. 4 schematically shows a computer system for semi-automated development data management according to an embodiment of the present invention.

FIG. 4 shows an embodiment of a computer system or PC. Said system comprises a processor CPU, which may in particular be implemented as a multi-core processor, a main memory RAM, and a bus controller BC. The computer system PC is preferably configured so as to be manually operated directly by a user, a monitor DIS being connected via a graphics card GPU, and a keyboard KEY and a mouse MOU being connected via a peripheral interface HMI. In principle, the human-machine interface of the computer system could also be configured as a touch user interface. The computer system further comprises a nonvolatile data store HDD, which may in particular be configured as a hard disk and/or solid state disk, and an interface NC, in particular a network interface. A central data store CDS is connected to the computer system via the interface. In this case, the central data store is often provided in the form of a database, as is also shown in the drawing.

As an alternative to the form shown in the drawing, the computer system may also comprise one or more servers comprising one or more processors, and a client connected thereto. In this case, the client comprises input and output devices and is connected to the server or servers by means of a network. In this case, the claimed method can also be executed in a distributed manner, i.e. in part by at least one of the servers and in part on a further server or the connected client. An example thereof would be execution in a cloud computing environment. The client may for example be configured as a standard computer, also referred to as a personal computer, comprising corresponding input and output devices and a network connection. Alternatively, a graphical user interface may also be displayed on a portable computer system and used by the user. Conventional portable computer systems are tablets or Smartphones comprising touch-sensitive operating displays.

A method for committing (data) objects, in particular technical development data, i.e. models, tests, parameters and the like, is thus proposed. The objects are provided in a database and can assume at least two states. In a first state the objects can be modified, and in a second state the objects cannot be modified and/or are committed. Two mutually dependent objects exist, the dependency being saved in the database.

A commitment specification or a ruleset or a release configuration is provided and is saved as an independent object, for example in a database. The commitment specification or the ruleset specifies which mutually dependent objects are committed together or published together as a release. According to a further aspect of the present invention, the method comprises the steps of selecting an object, selecting a commitment specification, automatically evaluating the commitment specification for the selected object in order to automatically specify all the objects that are to be committed, automatically committing the objects specified in the previous step in permanent versions, and saving the commitment specification used and the last committed objects in the permanent versions, including the dependencies between objects and commitment specifications.

The committed object is furthermore installed on a technical device, or a technical device is tested using the committed object. The commitment specification used and the committed objects are furthermore saved as a data storage data object. The commitment specification used, together with the committed object, is saved, or a new data object comprising the committed object and the commitment specification used is saved, it being possible for the state upon commitment to be retrieved from the data object(s).

The dependency of a reference from the permanent data model can be provided as a link set by the user. A commitment specification can be applied only for a specified set of objects. A commitment specification comprises or references additional scripts which are executed additionally, before or after one of the above-mentioned steps. Furthermore, the method can also be executed by a client-server system, the scripts being executed on the server and/or the client. According to an aspect of the present invention, a default commitment specification exists which represents the standard procedure during commitment. The commitment specifications can be edited by the user and can themselves be committed as objects. In general, a commitment specification of this kind can also be specified as a ruleset which can in turn itself be an object of the data model, i.e. a configuration data unit of the development data model.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a"

or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for management of development data for control devices, the method comprising:
   saving, by a control device test system, a development data model in a central data store, wherein the development data model comprises a plurality of configuration data units, and wherein the configuration data units each store control commands and/or configuration parameters;
   providing, by the control device test system, a ruleset and identifying an initial configuration data unit;
   identifying, by the control device test system, a subset of configuration data units within the development data model, wherein identifying the subset of configuration data units within the development data model comprises applying the provided ruleset to the development data model, and wherein applying the provided ruleset to the development data model comprises automatically identifying configuration data units which have a dependency relationship with the initial configuration data unit;
   saving, by the control device test system, the identified subset of configuration data units within the development data model, wherein the identified subset of configuration data units within the development data model comprises the initial configuration data unit and the identified configuration data units which have a dependency relationship with the initial configuration data unit; and
   testing, by the control device test system, a control device using the identified subset of configuration data units within the development data model.

2. The method according to claim 1, wherein the identified subset is saved without overwriting the development data model.

3. The method according to claim 1, wherein the development data model is subject to a different assignment of permissions relative to the saved identified subset.

4. The method according to claim 1, wherein write access to the saved identified subset is prohibited.

5. The method according to claim 1, wherein an additional configuration data unit is saved to the identified subset, wherein the additional configuration data unit includes information regarding the initial configuration data unit, the provided ruleset, the configuration data units of the identified subset, and/or further information regarding framework conditions.

6. The method according to claim 1, wherein the initial configuration data unit saved as part of the identified subset comprise a reference to the provided ruleset.

7. The method according to claim 1, wherein the provided ruleset is part of a hierarchically structured body of rulesets.

8. The method according to claim 1, wherein saving the identified subset is carried out iteratively.

9. The method according to claim 1, wherein the development data model comprises a test specification of the control device.

10. The method according to claim 1, wherein at least one control command describes a condition for a functionality of the control device.

11. The method according to claim 1, wherein at least one configuration parameter describes a requirement parameter for the control device.

12. The method according to claim 1, wherein a relationship exists indirectly between at least two configuration data units.

13. The method according to claim 1, wherein a relationship comprises a hierarchy, an inheritance, an association and/or a user-defined semantic model.

14. The method according to claim 1, wherein:
   saving the development data model is carried out on a server; and/or
   applying the provided ruleset is initiated by a client.

15. The method according to claim 1, wherein the control device test system comprises distributed network components.

16. The method according to claim 1, wherein the development data model describes generic data for a plurality of control device types and the identified subset is limited to one control device type.

17. A control device test system for management of development data for control devices, the system comprising:
   at least one processor; and
   at least one memory having processor-executable instructions stored thereon;
   wherein the at least one processor is configured to execute the processor-executable instructions to facilitate:
   saving a development data model in a central data store, wherein the development data model comprises a plurality of configuration data units, and wherein the configuration data units each store control commands and/or configuration parameters;
   providing a ruleset and identifying an initial configuration data unit;
   identifying a subset of configuration data units within the development data model, wherein identifying the subset of configuration data units within the development data model comprises applying the provided ruleset to the development data model, and wherein applying the provided ruleset to the development data model comprises automatically identifying configuration data units which have a dependency relationship with the initial configuration data unit;
   saving the identified subset of configuration data units within the development data model, wherein the identified subset of configuration data units within the development data model comprises the initial configuration data unit and the identified configuration data units which have a dependency relationship with the initial configuration data unit; and
   testing a control device using the identified subset of configuration data units within the development data model.

18. A non-transitory computer-readable medium having processor-executable instructions stored thereon for management of development data for control devices, wherein the processor-executable instructions, when executed, facilitate:
- saving a development data model in a central data store, wherein the development data model comprises a plurality of configuration data units, and wherein the configuration data units each store control commands and/or configuration parameters;
- providing a ruleset and identifying an initial configuration data unit;
- identifying a subset of configuration data units within the development data model, wherein identifying the subset of configuration data units within the development data model comprises applying the provided ruleset to the development data model, and wherein applying the provided ruleset to the development data model comprises automatically identifying configuration data units which have a dependency relationship with the initial configuration data unit;
- saving the identified subset of configuration data units within the development data model, wherein the identified subset of configuration data units within the development data model comprises the initial configuration data unit and the identified configuration data units which have a dependency relationship with the initial configuration data unit; and
- testing a control device using the identified subset of configuration data units within the development data model.

* * * * *